United States Patent [19]
Shin

[11] Patent Number: 5,723,899
[45] Date of Patent: Mar. 3, 1998

[54] SEMICONDUCTOR LEAD FRAME HAVING CONNECTION BAR AND GUIDE RINGS

[75] Inventor: Won Sun Shin, Seoul, Rep. of Korea

[73] Assignees: Amkor Electronics, Inc., Chandler, Ariz.; Anam Industrial Co., Ltd., Seoul, Rep. of Korea

[21] Appl. No.: 520,429

[22] Filed: Aug. 29, 1995

[30] Foreign Application Priority Data

| Aug. 30, 1994 | [KR] | Rep. of Korea | 94-21610 |
| Oct. 10, 1994 | [KR] | Rep. of Korea | 94-25861 |
| Oct. 10, 1994 | [KR] | Rep. of Korea | 94-26326 |

[51] Int. Cl.$^6$ .................................................. H01L 23/495
[52] U.S. Cl. .............. 257/666; 257/675; 257/707; 257/784; 257/667; 257/670; 257/691
[58] Field of Search ................... 257/666, 675, 257/707, 784, 667, 670, 691

[56] References Cited

U.S. PATENT DOCUMENTS

| 5,121,300 | 6/1992 | Shimizu | 257/666 |
| 5,168,368 | 12/1992 | Gow, 3rd et al. | 257/666 |
| 5,235,207 | 8/1993 | Ohi et al. | 257/670 |
| 5,309,019 | 5/1994 | Moline et al. | 257/670 |
| 5,420,758 | 5/1995 | Liang | 257/666 |
| 5,455,454 | 10/1995 | Oh et al. | 257/676 |
| 5,498,901 | 3/1996 | Chillara et al. | 257/666 |
| 5,543,657 | 8/1996 | Diffenderfer et al. | 257/670 |

FOREIGN PATENT DOCUMENTS

| 61-216453 | 9/1986 | Japan | 257/670 |
| 63-253635 | 10/1988 | Japan | 257/666.3 |
| 2-310955 | 12/1990 | Japan | 257/667 |

*Primary Examiner*—Mahshid D. Saadat
*Assistant Examiner*—T. M. Arroyo
*Attorney, Agent, or Firm*—Skjerven, Morrill, MacPherson, Franklin & Friel LLP

[57] ABSTRACT

A lead frame for semiconductor packages is disclosed. In the lead frame, some of the inner leads in the four sides are extended and provided with connection bars on their inside ends. Alternatively, diagonally arranged tie bars of the lead frame are extended and provided with a rectangular guide ring on their inside ends. The connection bar or guide ring functions as a dam for restricting possible overflow of adhesive, which adhesive is applied on the heat sink for bonding a semiconductor chip to the heat sink. The lead frame of the invention also prevents waste of expensive tape by letting the adhesive tape adhere only to the connection bars or to a given portion of the guide ring when mounting the lead frame to the heat sink and makes it possible higher integration of semiconductor chip by making connection bar and guide ring from the lead or the tie bar.

16 Claims, 10 Drawing Sheets

SEMICONDUCTOR LEAD FRAME HAVING CONNECTION BAR AND GUIDE RINGS

BACKGROUND OF THE INVENTION

1. Field of the Invention

The present invention relates in general to lead frames for semiconductor packages, more particularly to lead frames in which guide lead and/or guide ring is formed so that heat sink(HS) adhesion becomes easy, excessive overflow of chip adhesive means can be restricted and high integration of the semiconductor chip can be achieved.

2. Description of the Prior Art

Figure 1:
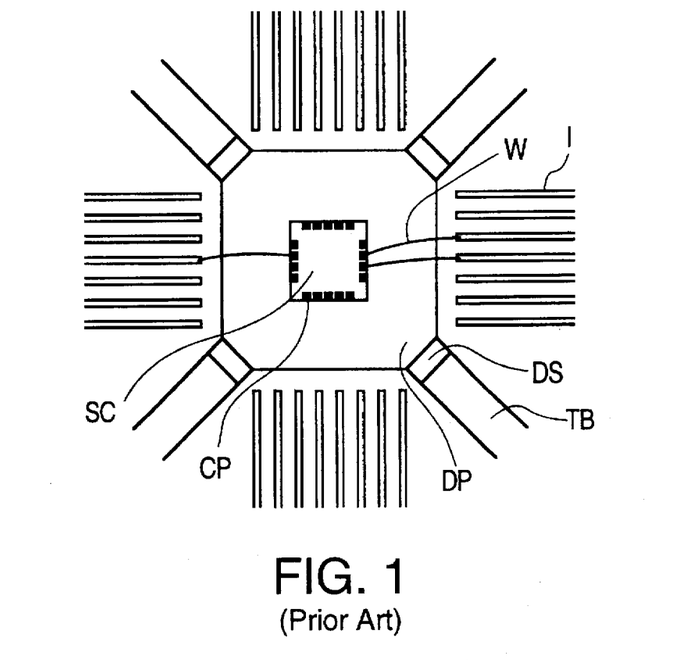
FIG. 1 is a plan view of a conventional lead frame with an integral die pad for a semiconductor package.

Referring to FIG. 1, the conventional lead frame includes a semiconductor chip SC having many chip pads CP fixed on the upper surface thereof, a mounting plate or die pad DP for mounting the semiconductor chip SC, tie bars TB each having a down set DS and formed integral to the die pad DP at a corner thereof, and many leads I positioned at four sides of the die pad DP and connected to the chip pads CD through wires W.

However, such a conventional lead frame has disadvantage in that it can not deal with the increasing number of the chip pads CP following recent advance of high integration of the semiconductor chip SC, adequately.

That is, even though the number of chip pads CD provided on the upper surface of the semiconductor chip SC increase following the high integration of the chip SC, since the number of the leads I of the lead frame connected to the chip pads CP through wire W can not be increased keeping pace with the increase of the number of installed chip pads CP, there has been difficulties in the high integration of the semiconductor chip SC.

Figure 2:
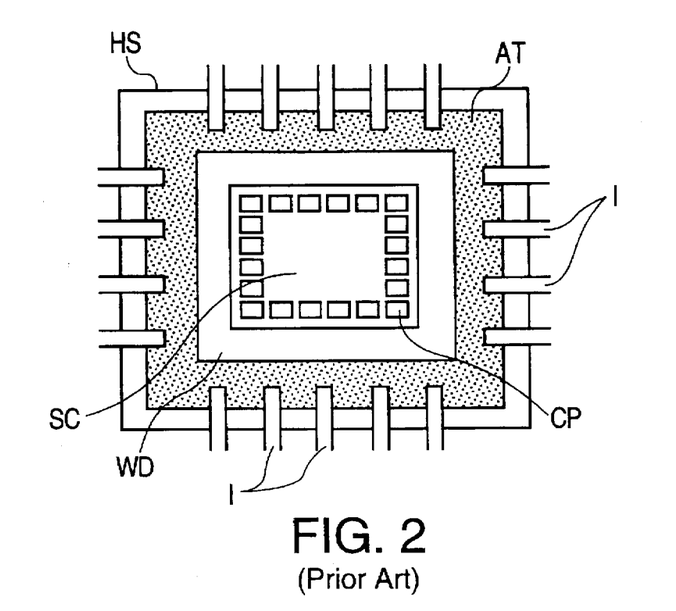
FIG. 2 is a plan view of a known heat sink-mounted lead frame without a die pad.

Meanwhile, another example of conventional lead frame LF on which a chip is mounted is illustrated in FIG. 2. To radiate heats from the chip during operation of a semiconductor device, a heat sink HS may be mounted on the upper surface or bottom surface of semiconductor chip mounting plate.

Figure 3:
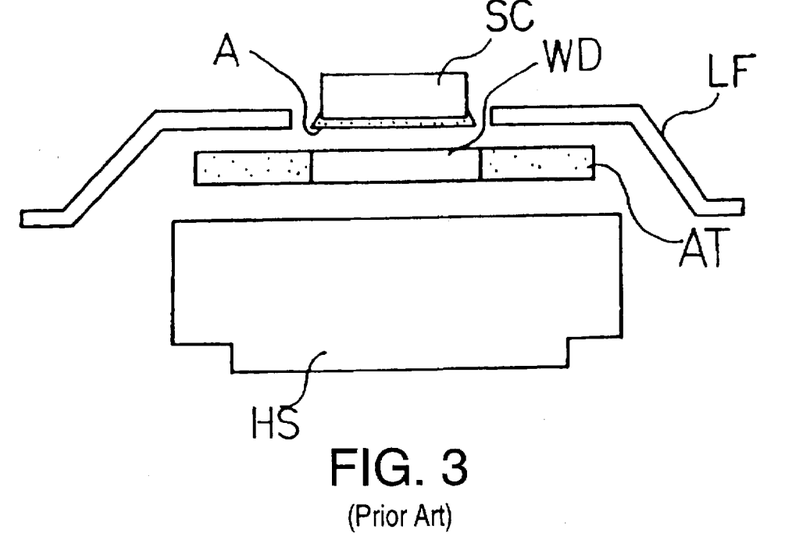
FIG. 3 is a side sectional view showing a bonding operation for bonding a semiconductor chip to the heat sink-mounted lead frame of FIG. 2.

In a typical lead frame LF free from semiconductor chip mounting plate, which mounting plate is a part of the lead frame for supporting the semiconductor chip with respect to the lead frame, the heat sink HS may be mounted on the bottom surface of the plateless lead frame LF using a rectangular adhesive tape AT as shown in FIGS. 2 and 3. The tape AT has on its center a window WD for bonding the chip SC to the heat sink HS.

In order to mount the heat sink HS on the bottom surface of the above plateless lead frame LF, all the inner leads I of the lead frame LF should be bonded to the rectangular adhesive tape AT. Hence, the expensive tape AT is wasted in production of semiconductor packages and this increases the cost of the packages.

Moreover, the above method for mounting the heat sink HS to the lead frame LF may cause another problem when excessive amount of adhesive A such as epoxy is applied on the top surface of the heat sink HS. That is, when the excessive amount of adhesive A is applied on the heat sink HS to bond the chip SC on the heat sink HS, the adhesive A may flow out of the chip bonding area, thus to cause delamination or crack of the package after package molding step. The lead frame LF is designed so that a plurality of inner leads I of a predetermined width, which inner leads I are attached to the tape AT, should be close to the edge of the chip SC. With the inner leads I, a problem may be caused in a wire bonding step that is carried out for interconnecting the

2 chip SC, which chip SC has a plurality of power chip pads, a plurality of ground chip pads and a plurality of pads for input or output of same signals, to the inner leads I of the lead frame LF. Such a problem may be also caused in a step for bonding the chip SC to the heat sink HS.

SUMMARY OF THE INVENTION

It is, therefore, an object of the present invention to provide a heat sink-mounted lead frame in which the above problems can be overcome and which either extends some of its inner leads and provides connection bars on the inside ends of the extended inner leads or extends tie bars and provides a rectangular guide ring on the inside ends of the extended tie bars, which connection bars or guide ring functions as a dam for restricting possible overflow of adhesive, which adhesive is applied on the heat sink for bonding a semiconductor chip to the heat sink, and which lead frame also prevents waste of expensive tape by letting the adhesive tape adhere only to the connection bars or to a given portion of the guide ring when mounting the lead frame to the heat sink.

The other object of the present invention is to provide a lead frame that can be a help for high integration of a semiconductor chip by providing guide rings on the lead frame, one of many raw materials used in a process for fabricating a semiconductor package, for connecting signal line pads, power line pads, and ground line pads etc,. of a semiconductor chip to the guide ring at the same time through wires.

In order to accomplish the above objects, a heat sink-mounted lead frame of the invention comprises a connection bar attached to the top surface of the heat sink, which connection bar is connected to an inside end of at least one of inner leads of the lead frame, which inner leads are arranged in the four directions about the top surface of the heat sink, and the selected inner lead is more extended inwardly than the other inner leads.

And a lead frame includes a semiconductor chip mounting plate having a plurality of chip pads and a semiconductor chip mounted on an upper surface thereof, tie bars each having a down set and formed integrated to the semiconductor chip mounting plate at both sides thereof, a plurality of leads positioned at four sides of the semiconductor chip mounting plate, and guide rings each positioned at a corner of the semiconductor chip mounting plate and having a part thereof positioned between the semiconductor chip mounting plate and a plurality of leads.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE EMBODIMENTS

Figure 4:
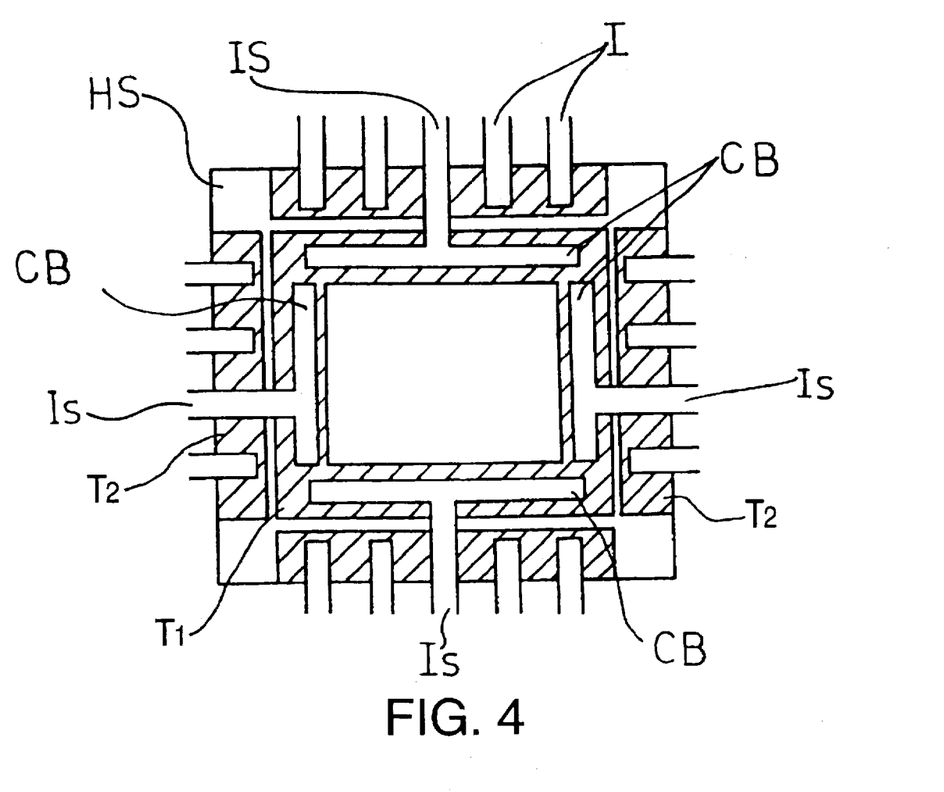
FIG. 4 is a plan view of a heat sink-mounted lead frame in accordance with a primary embodiment of the invention.

With reference to FIG. 4, there is shown a heat sink-mounted lead frame in accordance with the primary embodiment of the invention. In this drawing, attaching of inner leads of the quad lead frame LF to the heat sink HS is shown. In this primary embodiment, a center inner lead Is of the inner leads I, which leads I are arranged in each of the four directions about the heat sink HS, is more extended inwardly than the other inner leads I in each direction. The inside ends of the extended center inner leads Is are connected to their connection bars CB, so that the connection bars CB are perpendicular to the axes of associated center inner leads Is respectively. The connection bars CB of the center inner leads Is are attached to the heat sink HS using main attaching means $T_1$ such as rectangular adhesive tape, while the other inner leads I are attached to auxiliary attaching means $T_2$ such as tape pieces adhering to the four edges of the top surface of the heat sink HS.

Therefore, the four connection bars CB connected to the inside ends of the extended center inner leads Is are adjacent to each other at their ends, so that the connection bars CB form a rectangular guide ring. The guide ring of the connection bars CB functions as a dam for restricting possible overflow of adhesive A, for example, epoxy, even when excessive amount of adhesive A is applied on the heat sink HS during the semiconductor chip bonding step for bonding the chip SC to the top surface of the heat sink HS.

Figure 5:
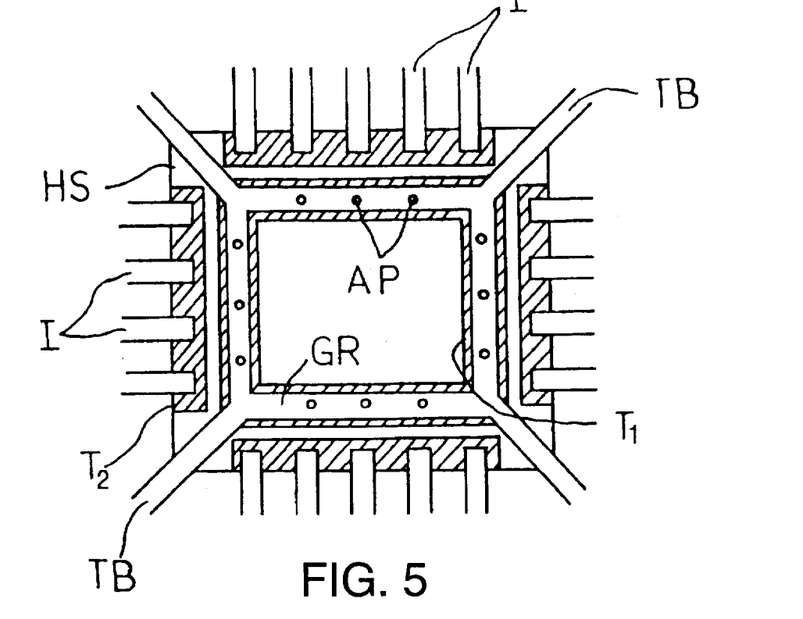
FIG. 5 is a plan view of a heat sink-mounted lead frame in accordance with a second embodiment of the invention.
Figure 6:
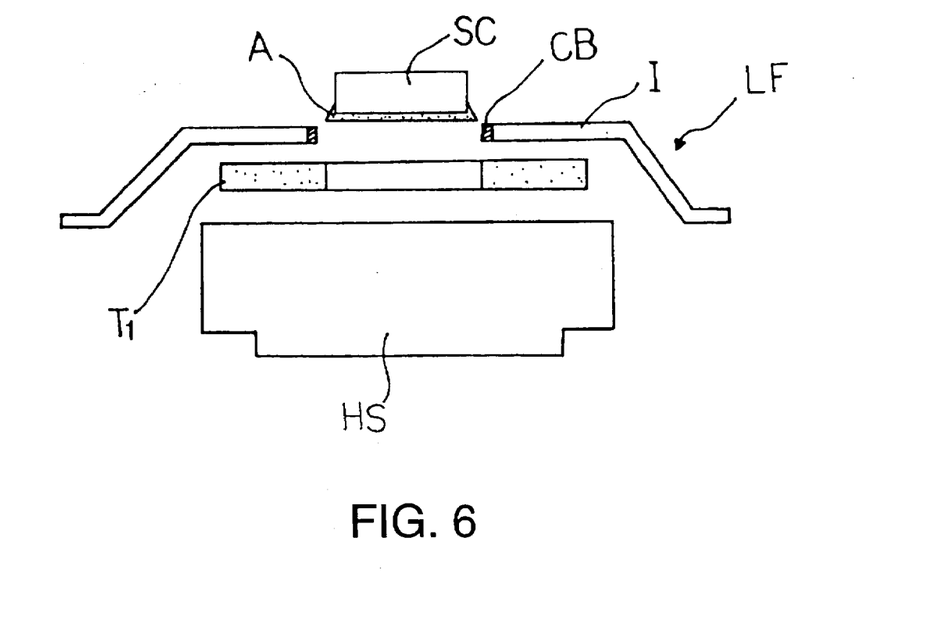
FIG. 6 is a side sectional view showing a bonding operation for bonding a semiconductor chip to a heat sink-mounted lead frame of the invention.

FIG. 5 shows the inner leads I of the quad lead frame bonded to the heat sink HS in accordance with a second embodiment of the invention. All the inner leads I that are arranged in the four directions are bonded to the auxiliary attaching means $T_2$ such as the tape pieces adhering to the four edges of the heat sink HS. In the second embodiment, four tie bars TB are diagonally arranged in the four corners of the heat sink HS. A rectangular guide ring GR is formed on the inside ends of the tie bars TB, so that the sides of the guide ring GR are extended between the inside ends of the tie bars TB. The guide ring GR is attached to the main attaching means $T_1$ which in turn adheres to the top surface of the heat sink HS.

The guide ring GR connected to the tie bars TB functions as a dam for restricting possible overflow of adhesive A even when excessive amount of adhesive A is applied on the chip bonding area of the heat sink HS during the semiconductor chip bonding step.

In forming of the connection bars CB of FIG. 4 or forming of the guide ring GR of FIG. 5, the bars CB or the ring GR are thicker than the lead frame LF, so that the function for restricting possible overflow of the adhesive A is reliably achieved. In addition, the bars CB and the ring GR are preferably provided with means AP for preventing their thermal deformation. In order to form the means AP, grooves or slots are formed on the bars CB and on the ring GR. With the means AP, the thermal stress applied on the bars CB and on the guide ring GR is absorbed and, as a result, a thermal deformation of the bars CB or of the ring GR can be prevented.

Figures 7A, 7B, 7C, 7D:
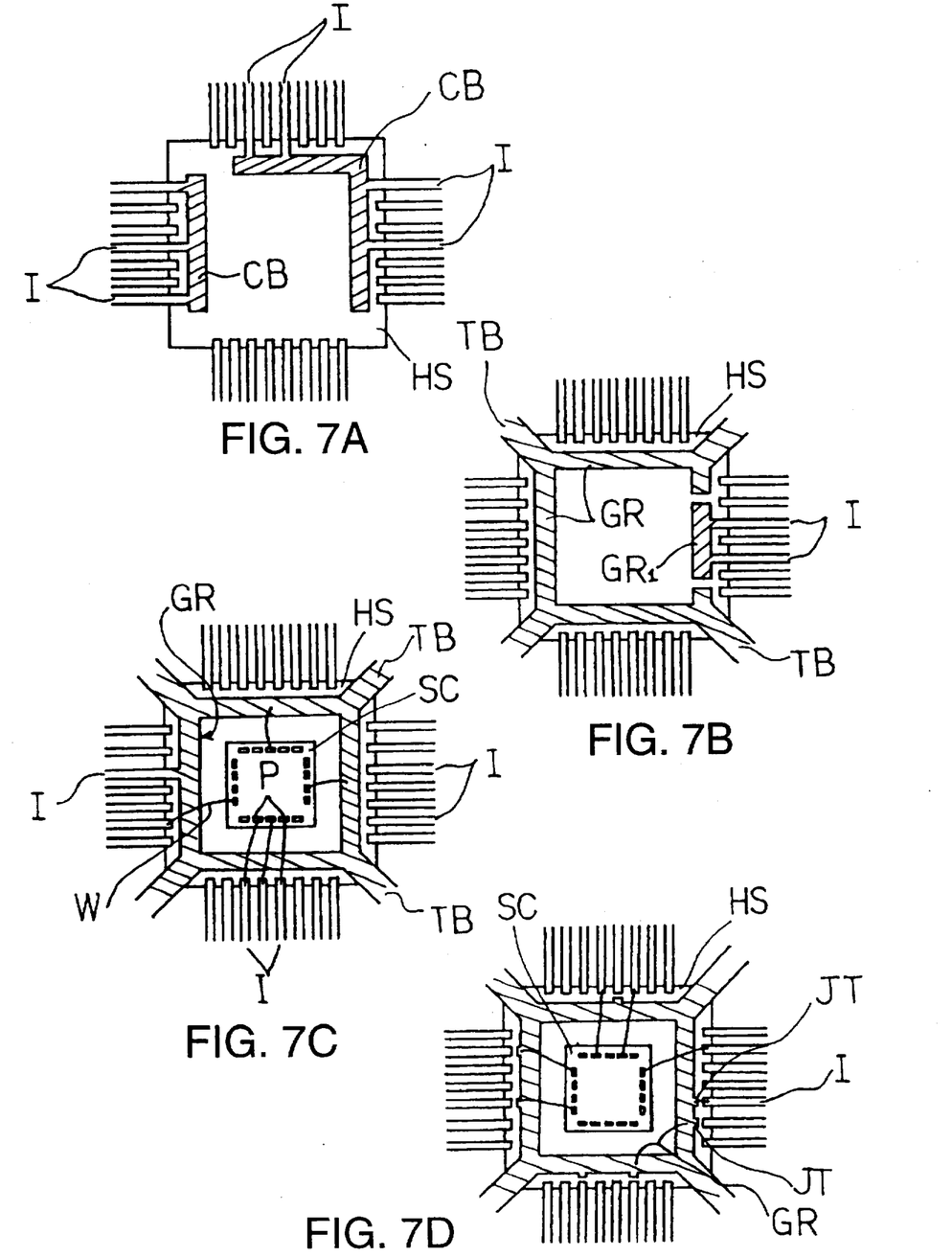
FIGS. 7A to 7H are plan views of heat sink-mounted lead frames in accordance with third to tenth embodiments of the invention.
Figure 7E:
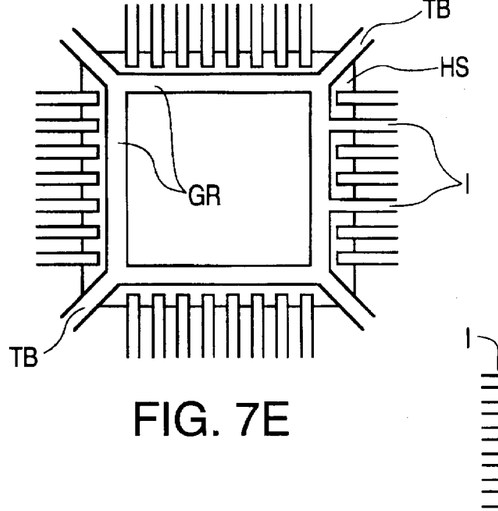

Turning to FIGS. 7A to 7H, there are shown heat sink-mounted lead frames LF having connection bars CB or guide rings GR in accordance with the third to eighth embodiments of the invention. In the embodiment of FIG. 7A, adjacent two connection bars CB are coupled to each other, so that the coupled bars CB form an integral L-shaped connection bar. In this embodiment, at least two inner leads I arranged in each direction are extended so that they are connected to the associated connection bars CB different from the primary embodiment. Therefore, the connection bars CB of this embodiment may be preferably used as ground pins or as power pins. In the embodiment of FIG. 7B, four corners of a rectangular guide ring GR are connected to the inside ends of the associated tie bars TB in the same manner as described for the second embodiment of FIG. 5. However, one side of the guide ring GR is cut different from the second embodiment. The cut piece $GR_1$ of the guide ring GR is connected to extended inner leads I, so that the guide ring GR is connected to at least two inner leads I and, at the same time, connected to the diagonally arranged tie bars TB. In the embodiments of FIGS. 7C and 7E, one side of the rectangular guide ring GR is connected to at least one inner lead I, so that the guide ring GR is connected to the inner lead I and, at the same time, connected to the tie bars TB.

In the embodiments of FIGS. 7C and 7E, one or two inner leads I that are connected to the guide ring GR may be used as the ground pins or as the power pins. Hence, those embodiments will provide much more pads on the semiconductor chip SC so as to improve the chip integration degree.

Figure 7F:
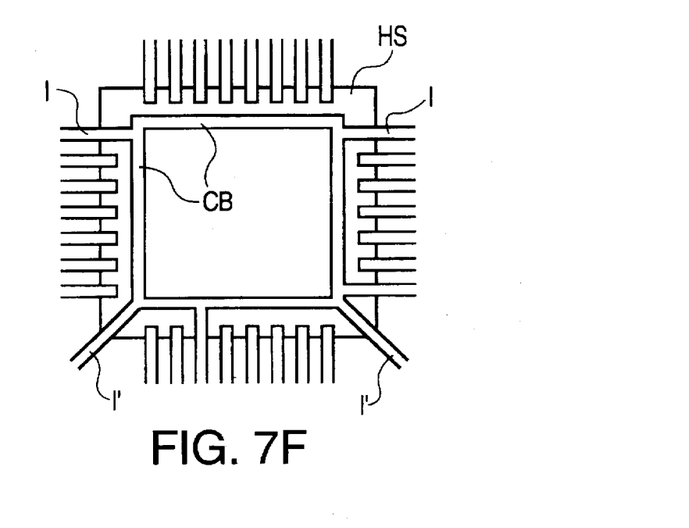
Figure 7G:
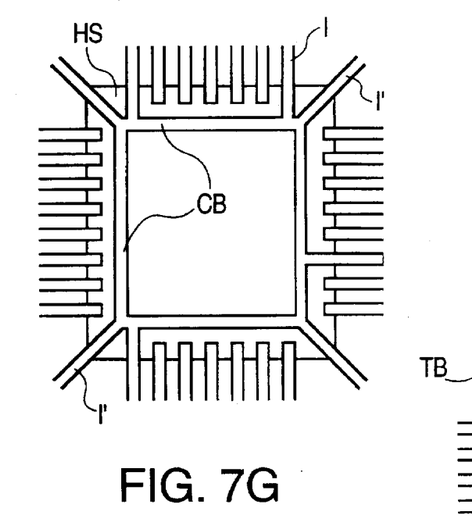

In the embodiment of FIG. 7D, the rectangular guide ring GR is provided with a plurality of joint tips JT, which tips JT are extended from outside edges of the guide ring GR toward the inner leads I. In this embodiment, the wire bonding operation for interconnecting the guide ring GR with the ground inner leads I by means of wires will be readily carried out due to the joint tips JT. In the embodiments of FIGS. 7F and 7G, optionally selected inner leads I of the lead frame free from tie bar are more extended inwardly than the other inner leads and the inside ends of the extended inner leads I are connected to each other by connection bars CB, which connection bars CB are integrated into one body connection bar in the rectangular shape. In the embodiment of FIG. 7F, two auxiliary leads I' having the same width as that of each inner lead I are coupled to two corners of the one body connection bar CB. The conventional singulation step for removing the tie bars will be adapted to the embodiment of FIG. 7F as desired. In the embodiment of FIG. 7G, all the four corners of the integral connection bar CB are coupled to their associated auxiliary leads I' which is different from the embodiment of FIG. 7F.

Figure 7H:
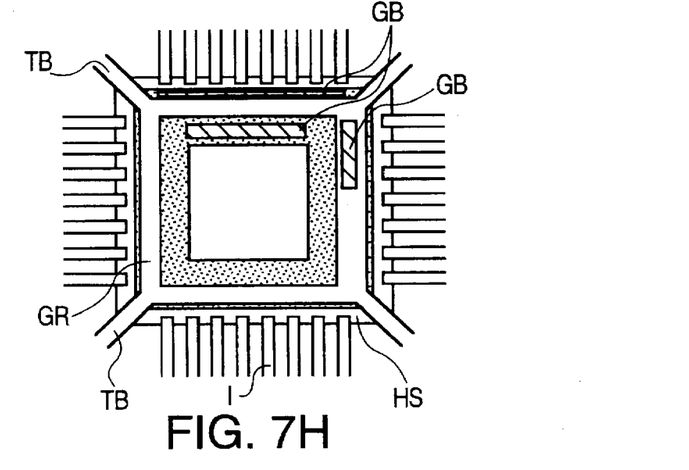

In the embodiment of FIG. 7H, ground bonding regions GB are respectively provided on the guide ring GR connected to the tie bars TB and on the main attaching means $T_1$ that attaches the guide ring GR to the heat sink HS. In this embodiment, the guide ring GR itself may be used as a ground terminal and occasionally used as a power terminal. In order to use the guide ring GR as the power terminal, the guide ring GR should be coupled to the power pad.

Figure 8:
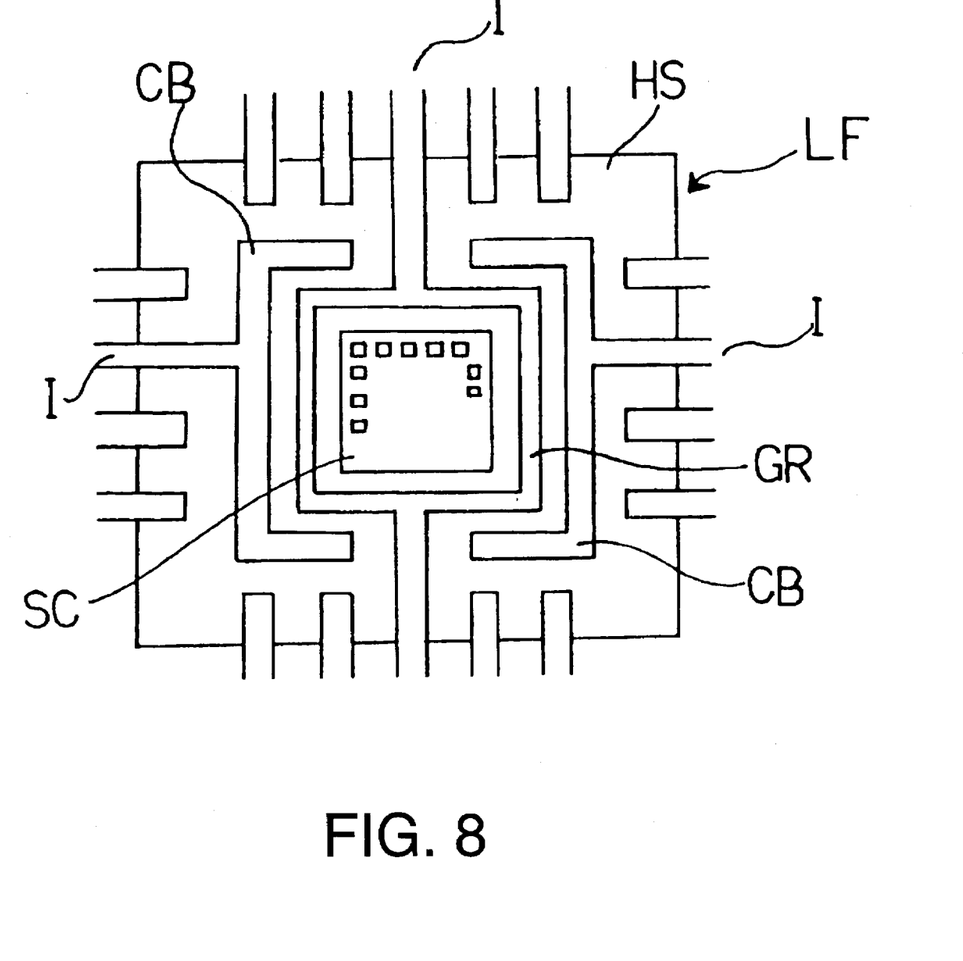
FIG. 8 is a plan view of a heat sink-mounted lead frame having both a guide ring and a pair of connection bars in accordance with a eleventh embodiment of the invention.

Turning to FIG. 8, there is shown a heat sink-mounted lead frame LF having a guide ring GR and a pair of connection bars CB in accordance with an eleventh embodiment of the invention. In this embodiment, the rectangular guide ring GR is located So as to be close to the chip SC. The guide ring GR is surrounded by a pair of connection bars CB. The connection bars CB are placed on opposite sides of the ring GR, and that the connection bars CB are symmetrized to each other about the ring GR. In this embodiment, the guide ring GR may be used as a ground bonding terminal, while the connection bars CB may be used as power terminals.

Figure 9A:
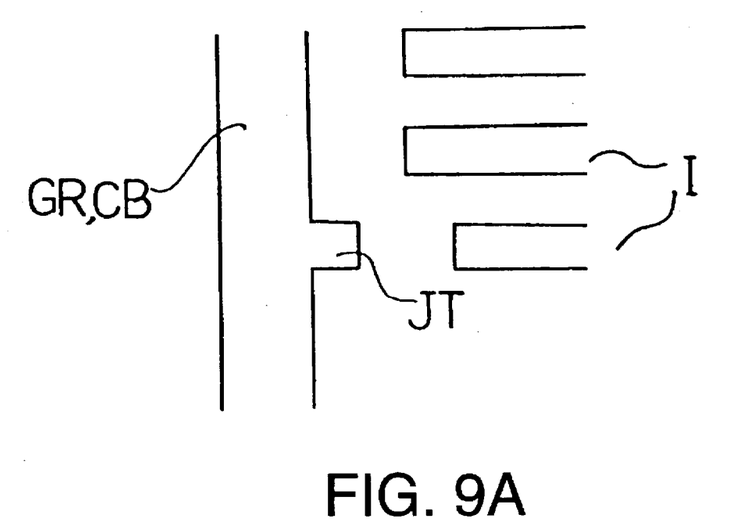
FIGS. 9A and 9B are schematic views, each showing positional relation between the inner leads and a joint tip of a guide ring or of a connection bar of a lead frame of the invention.
Figure 9B:
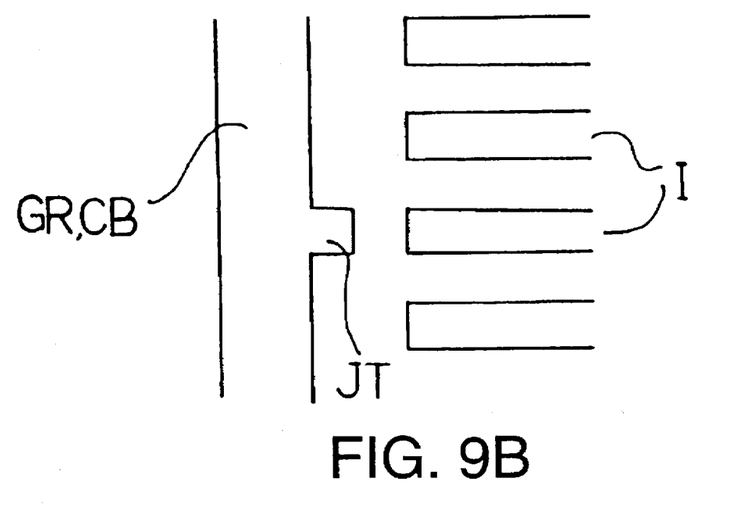

Each of FIGS. 9A and 9B shows positional relation between the inner leads I and the joint tip JT of a guide ring GR or of a connection bar CB of the invention. As shown in FIGS. 9A and 9B, the gap between one of the inner leads I or some of the inner leads I and the connection bar CB or the guide ring GR may differentiate from the other gaps. In these cases, the differentiating gap may be used as a ground bonding region.

Figure 10:
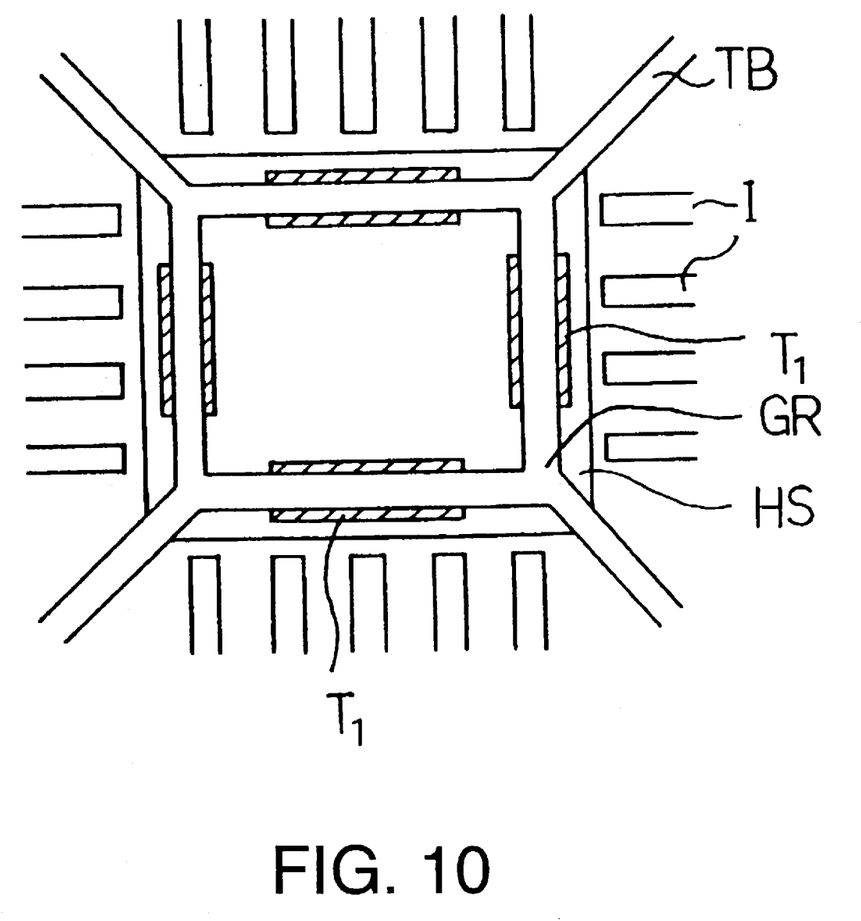
FIG. 10 is a plan view of a heat sink-mounted lead frame in accordance with a twelveth embodiment of the invention.

FIG. 10 is a plan view of a heat sink-mounted lead frame in accordance with a twelveth embodiment of the invention. In this embodiment, only a given portion of the guide ring GR is attached to the main attaching means $T_1$ adhering to the heat sink HS, while the inner leads I are not attached to the heat sink HS but separated from the heat sink HS. In accordance with this embodiment, waste of attaching means $T_1$ is minimized and this reduces the cost of the expensive attaching means.

FIGS. 11A to 11E are plan views of lead frames in accordance with thirteenth to seventeenth embodiments of the invention.

In these embodiments, the lead frames include, a semiconductor chip SC having a plurality of chip pads fixed on a upper surface thereof, a semiconductor chip mounting plate DP for mounting the semiconductor chip, tie bars TB each having a down set DS and formed to the semiconductor chip mounting plate DP at both sides thereof, a plurality of leads I positioned at four sides of the semiconductor chip mounting plate DP, and guide rings GR each positioned at a corner of the semiconductor chip mounting plate DP and having a part thereof positioned between the semiconductor chip mounting plate DP and the plurality of leads I.

Herein, each of the guide ring GR has at least one chip pad CP connected to the guide ring GR with a wire.

The construction and operation of this invention having the foregoing construction are to be explaned hereinafter in more detail, referring to FIG. 11A.

A guide ring GR is formed in section at each corner of the semiconductor chip mounting plate DP of the lead frame, a section of which guide ring is positioned between the semiconductor chip mounting plate DP and the plurality of leads I, one end of the guide ring section is connected to an end of a lead I, the other end of the guide ring section is connected to one end of other adjacent guide ring section, and a lead I is also connected to the interconnections between the guide ring sections.

That is, ends of a guide ring section are connected to either a lead I or an end of an adjacent guide ring section and a lead I at the same time.

Herein, each of the guide ring sections is connected to at least one chip pads CP mounted on the upper surface of the semiconductor chip SC with wires W, and the at least one chip pads CP connected to the guide ring GR at the same time has the same function to each other.

As such, by connecting a pluality of chip pads CP having the same function to a guide ring GR at the same time, permitting mounting of more chip pads CP in number on the upper surface of the semiconductor chip SC is made available.

For example, by connecting the chip pads CP, increasing in number as high integration of the semiconductor chip SC advances, to the guide ring GR on the same time putting the chip pads CP classified by functions together, solving the problem of chip pad bonding caused following the high integration, this invention can be a help for the high integration of the semiconductor chip SC.

And, there are tie bars TB each having a down set DS and the same shape as the lead I connected to both sides of the semiconductor chip mounting plate, which tie bars TB, connected and fixed to the lead frame, are two or four in number and serve to support the semiconductor chip mounting plate DP.

Figures 11A, 11B, 11C, 11D:
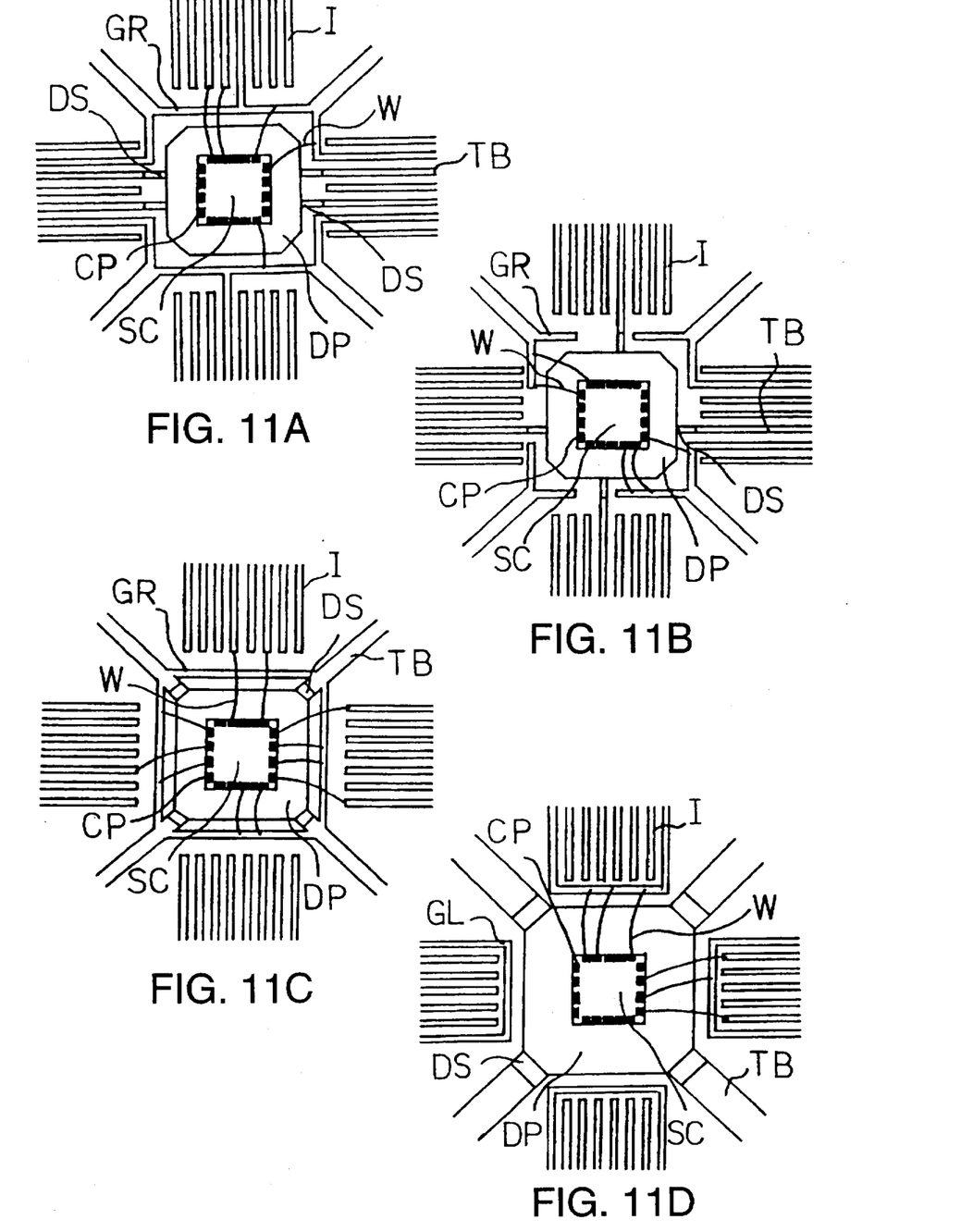
FIGS. 11A to 11E are plan views of lead frames in accordance with thirteenth to seventeenth embodiments of the invention.

On the other hand, the attached drawing FIG. 11B shows other embodiment of this invention, including guide rings GR each having all the two ends thereof either separated from the lead I or only one ends thereof connected with the lead I, and tie bars TB each having a down set DS and connected to the four sides of the semiconductor chip mounting plate DP.

And the attached drawing FIG. 11C shows another embodiment of this invention, including guide rings GR having the adjacent ends thereof connected to one another making all the guide rings GR connected together, and each having a down set DS at a part thereof connected to a corner of the semiconductor chip mounting plate DP and extended for supporting the semiconductor chip mounting plate DP.

In conclusion, ends of a guide ring GR in accordance with this invention can be formed connected to either a lead I or an end of an adjacent guide ring GR or nowhere making the guide ring independent.

That is, ends of a guide ring GR in accordance with this invention can be formed in various forms i.e., in a form connected to either a lead I or an end of an adjacent guide ring GR or independent of itself depending on, for example, the kind and the number or form of arrangement, of the chip pads CP mounted on the upper surface of the semiconductor chip SC, and the structure and form of the tie bars TB supporting the semiconductor chip mounting plate DP can also be formed varied to one another depending on the forms of such guide rings.

As such, the form of the guide ring GR in accordance with this invention being able to be varied for making easy bonding with the chip pads CP of the semiconductor chip SC, connected with many chip pads CP through wires W, can deal with the increase of chip pads CP in number, adequately.

Referring to FIG. 11D, guide leads GL similar to connection bar CB are formed between the semiconductor chip mounting plate DP and the plurality of leads I connected and integrated to extended leads I at both ends of many leads I to lie parallel along one side of the semiconductor chip mounting plate DP.

Herein, each of the guide lead GL is connected to at least more than one chip pads CP of same function through wires.

As such, by connecting a plurality of chip pads CP having the same function to a guide lead GL on the same time, permitting mounting of more chip pads CP in number on the upper surface of the semiconductor chip SC, high integration of a semiconductor chip SC is made available.

For example, by connecting the chip pads CP, increasing in number as high integation of the semiconductor chip SC advances, to the guide lead GL on the same time putting the chip pads CP classified by functions together, solving the problem of chip pad bonding, i.e., a problem that the number of the leads I of a lead frame can not be increased keeping pace with the increase of the number of chip pads CP caused following the high integration, this invention makes the high integration of the semiconductor chip SC possible.

Figure 11E:
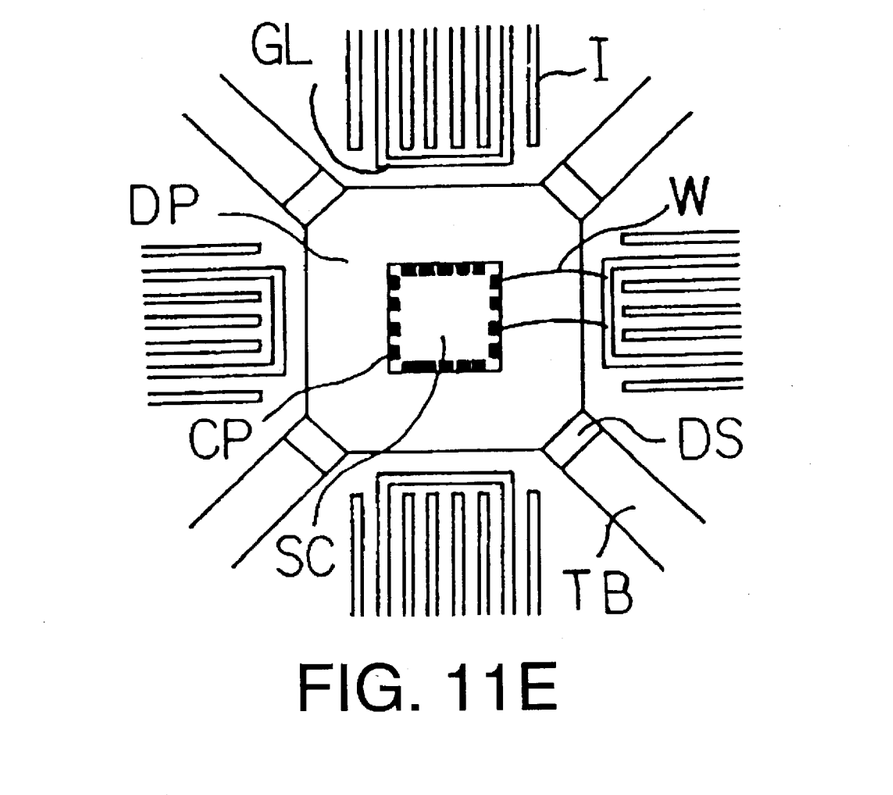

On the other hand, the attached drawing FIG. 11E shows another embodiment of this invention, including guide leads GL each formed by connecting any extended two leads I along one side of the semiconductor mounting plate DP.

As described above, the present invention readily mounts a lead frame free from the mounting plate to a heat sink by means of connection bars or of a guide ring when mounting the lead frame to the top surface of the heat sink using attaching means such as adhesive tape. In order to form the connection bars or the guide ring of the lead frame of the invention, either some of inner leads are more extended inwardly than the other inner leads or the diagonal tie bars are more extended inwardly. Thereafter, the connection bars or the guide ring in the rectangular shape is formed on the inside ends of the extended inner leads or of the extended tie bars. The connection bars or the guide ring is used in mounting the heat sink to the lead frame using attaching means such as adhesive tape. The invention thus reduces waste of expensive adhesive tape used as the attaching means. Moreover, the connection bars or the guide ring functions as a dam for restricting overflow of adhesive such as epoxy even when excessive amount of adhesive is applied on the heat sink for bonding the semiconductor chip to the heat sink. The invention thus improves the quality of the products. Another advantage of the invention is resided in that the connection bars or the guide ring is used as a common terminal, thus to improve the wire bonding operational efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A package for a semiconductor chip comprising:
   a heat sink including a surface with a first edge and a second edge;
   a leadframe comprising a plurality of leads,
   a first set of said plurality of leads being positioned at and extending over said first edge of said surface of said heat sink and a second set of said plurality of leads being positioned at and extending said second edge of said surface of said heat sink;
   a rectangular guide ring attached to said surface of said heat sink, said first set of said plurality of leads including at least one extended first lead extending further inwardly to said rectangular guide ring than leads of said first set other than said at least one extended first lead, said rectangular guide ring having sides connected to each other at their ends so as to form said rectangular guide ring; and
   a first connection bar attached to said surface of said heat sink, said second set of said plurality of leads including at least one extended second lead extending further inwardly to said first connection bar than leads of said second set other than said at least one extended second lead, wherein said rectangular guide ring is juxtaposed to said semiconductor chip and is located between said semiconductor chip and said first connection bar.

2. The package according to claim 1, further comprising:
   means for preventing thermal deformation of said rectangular guide ring by absorbing thermal stress applied on said rectangular guide ring, said deformation preventing means comprising grooves or slots formed on said rectangular guide ring.

3. The package according to claim 1, further comprising:
   a joint tip extended from said first connection bar toward said second set of said plurality of leads.

4. The package according to claim 1, further comprising:
   a joint tip extended from said rectangular guide ring toward said first set of said plurality of leads.

5. The package according to claim 1, wherein said semiconductor chip has a plurality of chip pads on a first surface, at least two of said plurality of chip pads are connected to said rectangular guide ring and thereby connected to said at least one extended first lead.

6. The package according to claim 1, wherein said rectangular guide ring is connected to a ground lead.

7. The package according to claim 1, wherein said rectangular guide ring is connected to a power lead.

8. The package according to claim 1, wherein said first connection bar is a power terminal, while said rectangular guide ring is a ground terminal.

9. The package according to claim 1 wherein said at least one extended second lead is connected to said first connection bar.

10. The package according to claim 1 further comprising a second connection bar attached to said surface of said heat sink, said first and second connection bars being placed on opposite sides of said rectangular guide ring.

11. The package according to claim 10 wherein said first and second connection bars are symmetrized to each other about said rectangular guide ring.

12. The package according to claim 1 wherein said semiconductor chip has a plurality of chip pads on a first surface, said package further comprising a plurality of bond wires, said bond wires electrically connecting selected ones of said chip pads to selected ones of said leads of said leadframe.

13. The package according to claim 2 wherein said surface of said heatsink further comprises a third edge and a fourth edge, said first and third edges of said surface of said heatsink being opposite from one another, said second and fourth edges of said surface of said heatsink being opposite from one another.

14. A package for a semiconductor chip comprising:
   a heat sink including a surface with edges;
   a leadframe comprising a plurality of leads, said surface of said heat sink having a set of said plurality of leads attached thereto at each of said edges by first tape pieces; and
   a rectangular guide ring attached to said surface of said heat sink by a second tape wherein a bottom surface of said rectangular guide ring is attached to said second tape which has a ground bonding region.

15. A package for a semiconductor chip comprising:
   a heat sink including a surface with edges;
   a leadframe comprising a plurlity of leads, said surface of said heat sink having a set of said plurality of leads attached thereto at each of said edges by first tape pieces; and
   a rectangular guide ring attached to said surface of said heat sink by a second tape wherein said rectangular guide ring has a ground bonding region.

16. A package for a semiconductor chip comprising:
   a heat sink including a surface with edges;
   a leadframe comprising a plurality of leads, said surface of said heat sink having a set of said plurality of leads attached thereto at each of said edges by first tape pieces; and
   a rectangular guide ring attached to said surface of said heat sink by a second tape wherein only a predetermined portion of said rectangular guide ring is attached to said second tape adhering to said surface of said heat sink.

* * * * *